United States Patent
Fox et al.

(10) Patent No.: US 10,358,717 B2
(45) Date of Patent: Jul. 23, 2019

(54) METHOD FOR DEPOSITING HIGH DEPOSITION RATE, THICK TETRAETHYL ORTHOSILICATE FILM WITH LOW COMPRESSIVE STRESS, HIGH FILM STABILITY AND LOW SHRINKAGE

(71) Applicant: Lam Research Corporation, Fremont, CA (US)

(72) Inventors: Keith Fox, Tigard, OR (US); Jonathan Church, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/493,802

(22) Filed: Apr. 21, 2017

(65) Prior Publication Data

US 2018/0305812 A1  Oct. 25, 2018

(51) Int. Cl.
| | |
|---|---|
| H05H 1/46 | (2006.01) |
| C23C 16/40 | (2006.01) |
| H01L 21/02 | (2006.01) |
| C23C 16/56 | (2006.01) |
| C23C 16/52 | (2006.01) |
| C23C 16/505 | (2006.01) |

(52) U.S. Cl.
CPC .......... *C23C 16/402* (2013.01); *C23C 16/505* (2013.01); *C23C 16/52* (2013.01); *C23C 16/56* (2013.01); *H01L 21/02164* (2013.01); *H01L 21/02216* (2013.01); *H01L 21/02274* (2013.01)

(58) Field of Classification Search
CPC .......... C23C 16/402; C23C 16/50–505; C23C 16/509; C23C 16/5096; C23C 16/52; C23C 16/56; H01L 21/02164; H01L 21/02274

USPC .......... 427/563, 574, 579; 438/789
See application file for complete search history.

(56) References Cited

U.S. PATENT DOCUMENTS

| | | | |
|---|---|---|---|
| 5,286,297 A * | 2/1994 | Moslehi | C23C 16/4405 118/723 E |
| 5,935,649 A | 8/1999 | Koizumi et al. | |
| 6,071,573 A | 6/2000 | Koemtzopoulos et al. | |

(Continued)

FOREIGN PATENT DOCUMENTS

| | | | |
|---|---|---|---|
| JP | 2004-336019 A | * | 11/2004 |
| JP | 2005-252012 A | * | 9/2005 |
| KR | 2013-0121061 A | | 11/2013 |

OTHER PUBLICATIONS

Bruce H. Mahan; University Chemistry, 3rd edition; Edison-Wesley publishing company; reading, Massachusetts, USA; 1975 (no month), excerpt pp. 33-47.*

(Continued)

*Primary Examiner* — Marianne L Padgett

(57) ABSTRACT

A method for reducing post-annealing shrinkage of silicon dioxide film includes arranging a substrate on a substrate support in a processing chamber; setting a pressure in the processing chamber to a predetermined pressure range; setting a temperature of the substrate support to a predetermined temperature range; supplying a process gas mixture to a gas distribution device. The process gas mixture includes TEOS gas, a gas including an oxygen species, and argon gas. The argon gas comprises greater than 20% of the process gas mixture by volume. The method further includes striking plasma and depositing the film on the substrate.

18 Claims, 2 Drawing Sheets

(56) References Cited

U.S. PATENT DOCUMENTS

| | | | |
|---|---|---|---|
| 6,121,164 A | 9/2000 | Yieh et al. | |
| 6,759,297 B1 * | 7/2004 | Dvorsky | B82Y 10/00 |
| | | | 257/E21.665 |
| 7,923,376 B1 | 4/2011 | Dhas et al. | |
| 8,486,792 B2 * | 7/2013 | Ueda | C23C 16/402 |
| | | | 118/723 AN |
| 9,165,762 B2 | 10/2015 | Crook et al. | |
| 9,570,289 B2 * | 2/2017 | Dhas | H01L 21/02274 |
| 10,199,388 B2 * | 2/2019 | Tsiang | H01L 21/3115 |
| 10,214,816 B2 * | 2/2019 | Haverkamp | C23C 16/24 |
| 2009/0056743 A1 | 3/2009 | Choi et al. | |
| 2011/0074013 A1 * | 3/2011 | Ueda | C23C 16/402 |
| | | | 257/734 |
| 2011/0236594 A1 * | 9/2011 | Haverkamp | C23C 16/24 |
| | | | 427/553 |
| 2013/0161629 A1 | 6/2013 | Han et al. | |
| 2013/0267081 A1 * | 10/2013 | Fox | H01L 21/324 |
| | | | 438/486 |
| 2013/0288486 A1 * | 10/2013 | Crook | H01L 21/02274 |
| | | | 438/788 |
| 2014/0118751 A1 * | 5/2014 | Rajagopalan | H01L 21/00 |
| | | | 356/630 |
| 2015/0013607 A1 | 1/2015 | Haverkamp et al. | |
| 2016/0293609 A1 * | 10/2016 | Jha | H01L 21/02274 |
| 2017/0092492 A1 | 3/2017 | Zhao et al. | |
| 2018/0233356 A1 * | 8/2018 | Han | H01L 21/02274 |

OTHER PUBLICATIONS

International Search Report and Written Opinion dated Jul. 31, 2018 corresponding to International Application No. PCT/US2018/028861; 9 pages.

* cited by examiner

METHOD FOR DEPOSITING HIGH DEPOSITION RATE, THICK TETRAETHYL ORTHOSILICATE FILM WITH LOW COMPRESSIVE STRESS, HIGH FILM STABILITY AND LOW SHRINKAGE

FIELD

The present disclosure relates to substrate processing systems, and more particularly to systems and methods for depositing tetraethyl orthosilicate (TEOS) film.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on substrates such as semiconductor wafers. Example processes that may be performed on a substrate include, but are not limited to, chemical vapor deposition (CVD), atomic layer deposition (ALD), plasma-enhanced CVD (PECVD), and plasma-enhanced ALD (PEALD). A substrate may be arranged on a substrate support, such as a pedestal, an electrostatic chuck (ESC), etc. in a processing chamber of the substrate processing system. During processing, a gas mixture is introduced into the processing chamber and plasma may be used to enhance chemical reactions within the processing chamber.

Tetraethyl orthosilicate (TEOS) precursor gas may be used when depositing silicon dioxide ($SiO_2$) film on a substrate. For TEOS-based films, film stability and shrinkage are linearly related to deposition temperature. In general, higher deposition temperatures and more compressive as-deposited film correspond to increased stability during post deposition integration steps at higher temperatures. Some substrate applications require relatively thick TEOS film. The stress of the TEOS film is tuned to be neutral or slightly compressive. However, TEOS deposition rates decrease significantly with increasing deposition temperature, which reduces throughput.

SUMMARY

A method for reducing post-annealing shrinkage of silicon dioxide film includes arranging a substrate on a substrate support in a processing chamber; setting a pressure in the processing chamber to a predetermined pressure range; setting a temperature of the substrate support to a predetermined temperature range; supplying a process gas mixture to a gas distribution device. The process gas mixture includes tetraethyl orthosilicate (TEOS) gas, a gas including an oxygen species, and argon gas. The argon gas comprises greater than 20% of the process gas mixture by volume. The method further includes striking plasma and depositing the film on the substrate.

In other features, the method includes annealing the film.

In other features, the method includes supplying the TEOS gas, the gas including the oxygen species, and the argon gas to a mixing manifold to create the process gas mixture; and delivering the processing gas mixture to the gas distribution device arranged above the substrate support.

In other features, the method includes supplying a secondary purge gas to the processing chamber. The secondary purge gas includes argon.

In other features, the predetermined temperature range is from 400° C. to 600° C. The predetermined pressure range is from 2 to 4 Torr. The predetermined pressure range is from 3.2 to 3.8 Torr.

In other features, striking plasma comprises supplying HF power to one of an upper electrode and a lower electrode in a range from 1000 to 5000 W and LF power to the one of the upper electrode and the lower electrode in a range from 500 to 5000 W.

In other features, striking plasma comprises supplying HF power to one of an upper electrode and a lower electrode in a range from 2000 to 3000 W and LF power to the one of the upper electrode and the lower electrode in a range from 1000 to 3000 W.

In other features, striking plasma comprises striking plasma comprising supplying HF power to one of an upper electrode and a lower electrode in a range from 2000 to 3000 W and LF power to the one of the upper electrode and the lower electrode in a range from 1500 to 2100 W.

In other features, the gas including oxygen species is selected from a group consisting of molecular oxygen ($O_2$) and/or nitrous oxide ($N_2O$). The gas including oxygen species is supplied at a flow rate in a range from 15 slm to 30 slm. The gas including oxygen species is supplied at a flow rate in a range from 20 slm to 25 slm. The TEOS gas is supplied at a flow rate in a range from 40 sccm to 70 sccm. The TEOS gas is supplied at a flow rate in a range from 50 sccm to 60 sccm.

In other features, the argon gas is supplied at a flow rate in a range from 7 slm to 20 slm. The argon gas is supplied at a flow rate in a range from 7 slm to 15 slm. The secondary purge gas is supplied at a flow rate in a range from 7 slm to 10 slm.

In other features, the method includes performing the annealing for a predetermined period in a range from 20 to 40 minutes at a temperature in a temperature range from 700° C. to 800° C. The annealing is performed using molecular nitrogen ($N_2$) gas. The processing chamber performs plasma-enhanced chemical vapor deposition. The film has a thickness in a range from 3 micrometers to 12 micrometers. The argon gas is in a range from 20% to 40% of the process gas mixture by volume.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Deposition systems and methods according to the present disclosure allow tetraethyl orthosilicate (TEOS)-based film to be deposited at relatively high thicknesses with relatively low post annealing shrinkage and with neutral or slightly compressive tuning. The deposition systems and methods according to the present disclosure supply a process gas mixture including the TEOS precursor gas, argon (Ar) gas, and another gas including oxygen species. In some examples, the thickness of the TEOS-based film is between 3 µm and 12 µm, although other film thicknesses may be used.

In some examples, the TEOS gas, the gas including oxygen species and the Ar gas are mixed in a mixing manifold and then supplied by a gas distribution device such as a showerhead to a processing chamber. In some examples, the Ar gas is supplied at a relatively high flow rate (greater than 7 slm) in the process gas mixture. The Ar gas, when supplied at the higher flow rate, reduces post annealing shrinkage of the TEOS-based film while meeting other film property targets.

Figure 1:
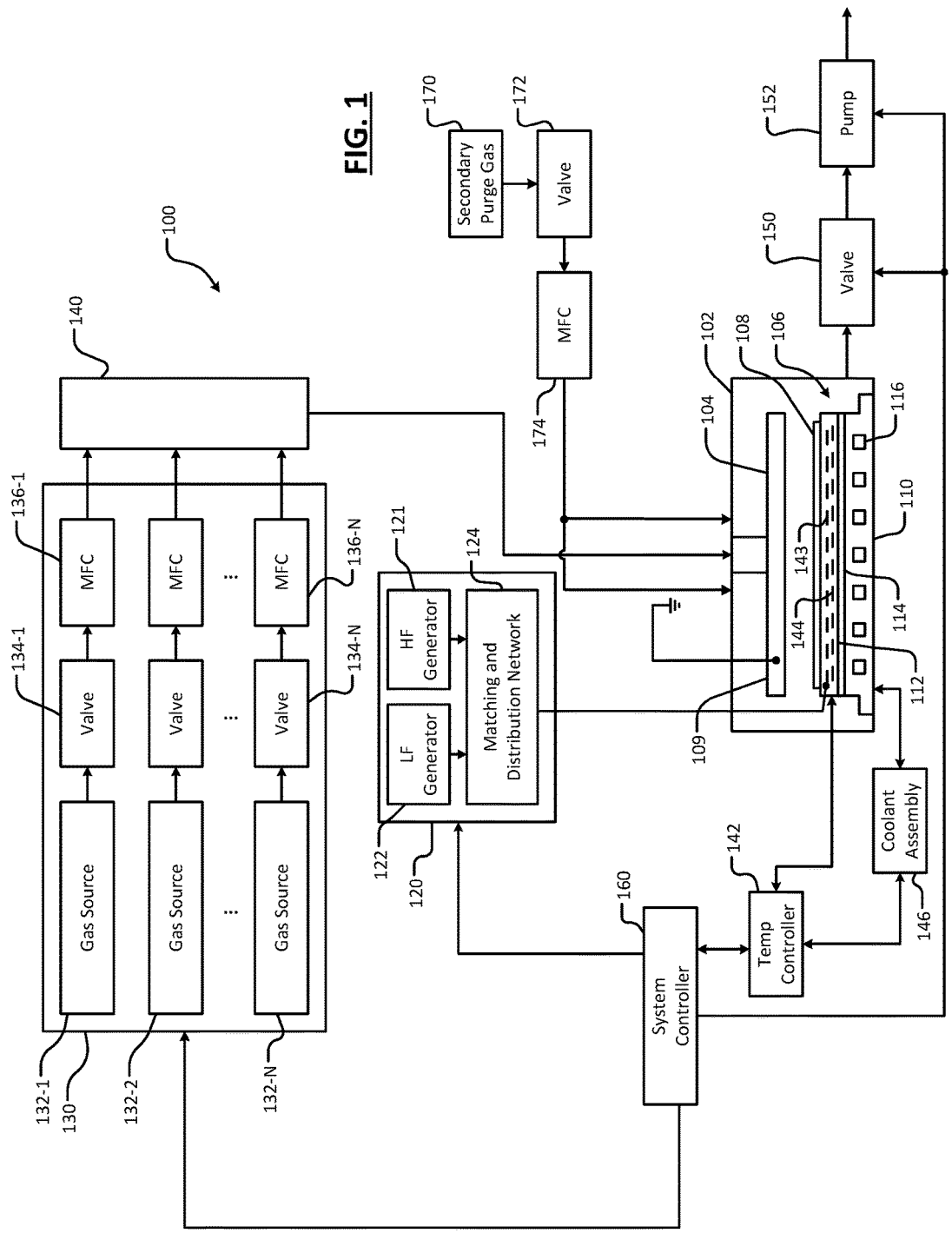
FIG. 1 is a functional block diagram of an example of substrate processing system for depositing tetraethyl orthosilicate (TEOS) film according to the present disclosure.

Referring now to FIG. 1, an example substrate processing system 100 for performing deposition is shown. While a PECVD substrate processing system is shown, a PEALD substrate processing system or other substrate processing system can be used. The substrate processing system 100 includes a processing chamber 102 that encloses other components of the substrate processing system 100 and contains the plasma. The substrate processing system 100 includes a gas distribution device 104 and a substrate support 106, such as an electrostatic chuck (ESC). During operation, a substrate 108 is arranged on the substrate support 106.

For example only, the gas distribution device 104 may include a showerhead 109 that distributes process gases over the substrate. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of distributed holes through which process gas flows. The gas distribution device 104 may be made of a metallic material and may act as an upper electrode. Alternately, the gas distribution device 104 may be made of a non-metallic material and may include an embedded electrode. In other examples, the upper electrode may include a conducting plate and the process gases may be introduced in another manner.

The substrate support 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode (e.g the gas distribution device 104) and the lower electrode (e.g., the baseplate 110 of the substrate support 106). The other one of the upper electrode and the lower electrode may be DC grounded, AC grounded or floating. For example only, the RF generating system 120 may include a high frequency (HF) generator 121 and a low frequency (LF) generator 122 that generate the HF and LF power (at predetermined frequencies and power levels, respectively) that is fed by a matching and distribution network 124 to the upper electrode or the lower electrode.

A gas delivery system 130 includes one or more gas sources 132-1, 132-2, . . . , and 132-N (collectively gas sources 132), where N is an integer greater than zero. The gas sources 132 supply one or more process gas mixtures, carrier gas and/or purge gas. In some examples, the gas delivery system delivers a mixture of TEOS gas, a gas including an oxygen species and argon (Ar) gas during deposition. The gas sources 132 are connected by valves 134-1, 134-2, . . . , and 134-N (collectively valves 134) and mass flow controllers 136-1, 136-2, . . . , and 136-N (collectively mass flow controllers 136) to a mixing manifold 140. The gases are supplied to the mixing manifold 140 and mixed therein. An output of the mixing manifold 140 is fed to the processing chamber 102. For example only, the output of the mixing manifold 140 is fed to the showerhead 109. Secondary purge gas 170 may be supplied to the processing chamber such as behind the showerhead 109 via a valve 172 and MFC 174.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate. The temperature controller 142 may be used to control the plurality of TCEs 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to control pressure and to evacuate reactants from the processing chamber 102. A system controller 160 may be used to control components of the substrate processing system 100. Although shown as separate controllers, the temperature controller 142 may be implemented within the system controller 160.

Figure 2:
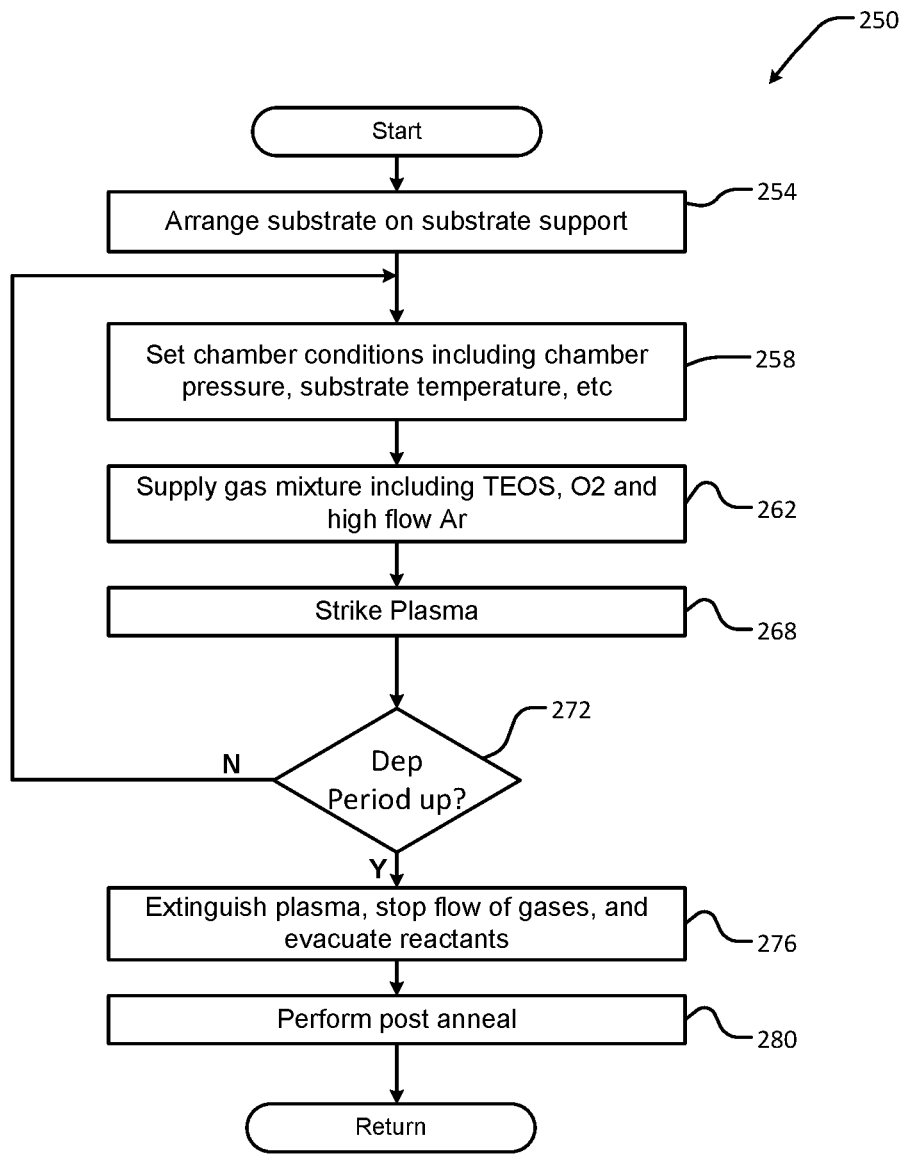
FIG. 2 is a flowchart illustrating an example of a method for depositing thick TEOS film with improved film stability and shrinkage according to the present disclosure.

Referring now to FIG. 2, a method 250 for depositing TEOS film with low shrinkage is shown. At 254, a substrate is arranged on the substrate support in the substrate processing chamber. At 258, operating parameters or conditions for the process are set including chamber pressure, substrate support temperature, etc. At 262, a process gas mixture is supplied to the processing chamber. In some examples, gases are supplied to and mixed in the manifold. The gases include TEOS gas, a gas including an oxygen species and argon (Ar) gas. In some examples, the gas including the oxygen species includes molecular oxygen ($O_2$) and/or nitrous oxide ($N_2O$), although other gases including oxygen species may be used.

Secondary purge gas may also be supplied to the processing chamber at the same time as the process gas mixture. In some examples, the secondary purge gas may be supplied behind the showerhead, through a collar of the showerhead, or in other locations such as from sidewalls of the processing chamber. In some examples, the purge gas includes argon (Ar) gas. In some examples, the Ar gas is supplied in the process gas mixture at a relatively high flow rate as will be described further below to reduce post annealing shrinkage.

At 268, plasma is struck in the processing chamber by supplying power across the upper and lower electrodes while the process gas mixture is supplied. When the deposition period is over as determined at 272, the method extinguishes the plasma, stops the flow of process gases and evacuates reactants at 276. At 280, post annealing is performed on the substrate in the same processing chamber or a different processing chamber.

In some examples, a temperature of the substrate support 106 is controlled to a deposition temperature in a temperature range from 400° C. to 600° C. In some examples, the temperature range is from 425° C. to 525° C. In some examples, the temperature range is from 450° C. to 500° C. In some examples, the deposition temperature of the substrate support 106 during deposition is 475° C.

In some examples, the pressure in the chamber is set to a pressure in a pressure range from 1 to 10 Torr. In some examples, the pressure range is from 2 to 4 Torr. In some examples, the pressure range is from 3.2 to 3.8 Torr.

In some examples, the HF power is set in a range from 1000 to 5000 W. In some examples, the HF power range is from 2000 to 3000 W. In some examples, the HF power is 2500 W during deposition. In some examples, the HF is set to a frequency range from 10 to 15 MHz. In some examples, the HF is set to 13.34 MHz.

In some examples, the LF power is set in a range from 500 to 5000 W. In some examples, the LF power range is from 1000 to 3000 W. In some examples, the LF power range is from 1500 to 2100 W. In some examples, the LF is set to a frequency range from 200 kHz to 3 MHz. In some examples, the LF is set to 400 KHz. In some examples, the LF is set to 2 MHz.

In some examples, the $O_2$ is supplied at a gas flow rate in a range from 15 slm to 30 slm. In some examples, the $O_2$ gas flow rate is in a range from 20 slm to 25 slm. While specific $O_2$ flow rates are disclosed, other flow rates can be used.

In some examples, the TEOS gas is supplied at a gas flow rate in a range from 40 sccm to 70 sccm. In some examples, the TEOS gas flow rate is in a range from 50 sccm to 60 sccm. In some examples, the TEOS gas is supplied at 58 sccm during deposition, although other flow rates can be used. While specific TEOS flow rates are disclosed, other flow rates can be used.

In some examples, the Ar gas is supplied in the process gas mixture at a gas flow rate in a range from 7 slm to 20 slm. In some examples, the Ar gas flow rate is in a range from 7 slm to 15 slm. While specific Ar gas flow rates to the manifold are disclosed, other flow rates can be used.

In some examples, Ar is supplied as secondary purge gas at a gas flow rate in a range from 7 slm to 10 slm. In some examples, the Ar secondary purge gas flow rate is in a range from 8 slm to 10 slm. In some examples, the Ar secondary purge gas is supplied to the processing chamber at 9 slm, although other flow rates can be used.

In some examples, post annealing can be performed in a processing chamber for a period in a range from 20 to 40 minutes at a temperature in a range from 700° C. to 800° C. In some examples, the annealing can be performed using molecular nitrogen ($N_2$) or another gas. In some examples, the annealing is performed for 30 minutes at 750° C. in the presence of molecular nitrogen ($N_2$) gas.

EXAMPLES

The following examples in Table 1 below illustrate reduced post anneal shrinkage of relatively thick TEOS film (e.g. in a range from 3 μm to 12 μm):

TABLE 1

| Parameters | Example 1 | Example 2 | Example 3 | Example 4 |
|---|---|---|---|---|
| Substrate Support Temp | 475° C. | 475° C. | 475° C. | 475° C. |
| TEOS Flow | 58 sccm | 58 sccm | 58 sccm | 58 sccm |
| $O_2$ Flow Rate | 25 slm | 25 slm | 23 slm | 20 slm |
| Chamber Press | 3.4 Torr | 3.4 Torr | 3.4 Torr | 3.4 Torr |
| HF Power | 2500 W | 2500 W | 2500 W | 2500 W |
| LF Power | 2100 W | 2050 W | 1850 W | 1680 W |
| Secondary Purge Ar Flow | 9 slm | 9 slm | 9 slm | 9 slm |
| Ar Flow Rate to Manifold | 5 slm | 8 slm | 13 slm | 15 slm |
| As Dep Stress at 3 um thickness | −61 MPa | −63 MPa | −58 MPa | −59 MPa |
| Post Anneal Shrinkage | 0.77% | 0.63% | 0.53% | 0.52% |

As can be seen above, as the Ar flow rate to the manifold increases from 5 slm to higher values such as greater than 7 slm to 15 slm, the shrinkage decreases significantly while maintaining acceptable stress levels. In other words, the shrinkage decreases significantly as the Ar gas increases to greater than or equal to 20% by volume of the process gas mixture supplied to the gas distribution device 104. In some examples, the Ar gas is in a range from 20% to 45% by volume of the process gas mixture supplied to the gas distribution device 104.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for reducing shrinkage of silicon dioxide film, comprising:
   arranging a substrate on a substrate support in a processing chamber;
   setting a pressure in the processing chamber to a predetermined pressure range;
   setting a temperature of the substrate support to a predetermined temperature range;
   supplying a process gas mixture to a gas distribution device, wherein the process gas mixture includes tetraethyl orthosilicate (TEOS) gas, a molecular oxygen gas, and argon gas, wherein the argon gas comprises greater than 20% of the process gas mixture by volume;
   striking plasma while supplying the process gas mixture to deposit the silicon dioxide film on the substrate; and
   annealing the silicon dioxide film,
   wherein the TEOS gas is supplied at a first flow rate in a range from 40 sccm to 70 sccm, the molecular oxygen gas is supplied at a second flow rate in a range from 15 slm to 30 slm, and the argon gas is supplied at a third flow rate in a range from 7 slm to 20 slm to decrease post-annealing shrinkage of the silicon dioxide film as compared to using lower argon gas flow rates for the third flow rate.

2. The method of claim 1, further comprising:
   supplying the TEOS gas, the molecular oxygen gas, and the argon gas to a mixing manifold to create the process gas mixture; and
   delivering the processing gas mixture to the gas distribution device arranged above the substrate support.

3. The method of claim 1, further comprising supplying a secondary purge gas to the processing chamber.

4. The method of claim 3, wherein the secondary purge gas includes argon.

5. The method of claim 1, wherein the predetermined temperature range is from 400° C. to 600° C.

6. The method of claim 1, wherein the predetermined pressure range is from 2 to 4 Torr.

7. The method of claim 1, wherein the predetermined pressure range is from 3.2 to 3.8 Torr.

8. The method of claim 1, wherein the striking plasma comprises supplying HF power to one of an upper electrode and a lower electrode in a range from 1000 to 5000 W and LF power to the one of the upper electrode and the lower electrode in a range from 500 to 5000 W.

9. The method of claim 1, wherein the striking plasma comprises supplying HF power to one of an upper electrode and a lower electrode in a range from 2000 to 3000 W and LF power to the one of the upper electrode and the lower electrode in a range from 1000 to 3000 W.

10. The method of claim 1, wherein the striking plasma comprises supplying HF power to one of an upper electrode and a lower electrode in a range from 2000 to 3000 W and LF power to the one of the upper electrode and the lower electrode in a range from 1500 to 2100 W.

11. The method of claim 1, wherein the molecular oxygen gas is supplied at the second flow rate in a range from 20 slm to 25 slm.

12. The method of claim 1, wherein the TEOS gas is supplied at the first flow rate in a range from 50 sccm to 60 sccm.

13. The method of claim 1, wherein the argon gas is supplied at the third flow rate in a range from 7 slm to 15 slm.

14. The method of claim 4, wherein the secondary purge gas is supplied at a fourth flow rate in a range from 7 slm to 10 slm.

15. The method of claim 1, further comprising annealing the silicon dioxide film for a predetermined period in a range from 20 to 40 minutes at a temperature in a temperature range from 700° C. to 800° C.

16. The method of claim 15, wherein the annealing is performed using molecular nitrogen ($N_2$) gas.

17. The method of claim 1, wherein the silicon dioxide film has a thickness in a range from 3 micrometers to 12 micrometers.

18. The method of claim 1, wherein the argon gas is in a range from 20% to 40% by volume of the process gas mixture.

\* \* \* \* \*